US012774927B2

(12) United States Patent
Berger et al.

(10) Patent No.: US 12,774,927 B2
(45) Date of Patent: Oct. 27, 2026

(54) TEMPERATURE MEASURING DEVICE, LITHOGRAPHY APPARATUS AND METHOD FOR MEASURING A TEMPERATURE

(71) Applicant: Carl Zeiss SMT GmbH, Oberkochen (DE)

(72) Inventors: Lars Berger, Aalen-Unterkochen (DE); Thomas Rettenmaier, Aalen-Dewangen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 334 days.

(21) Appl. No.: 18/420,245

(22) Filed: Jan. 23, 2024

(65) Prior Publication Data

US 2024/0159600 A1 May 16, 2024

Related U.S. Application Data

(63) Continuation of application No. PCT/EP2022/072076, filed on Aug. 5, 2022.

(30) Foreign Application Priority Data

Aug. 6, 2021 (DE) ..................... 10 2021 208 562.8

(51) Int. Cl.
*G01K 7/20* (2006.01)
*G01R 19/00* (2006.01)
(Continued)

(52) U.S. Cl.
CPC ........... *G01K 7/20* (2013.01); *G01R 19/0038* (2013.01); *G01R 19/155* (2013.01); *G01R 27/02* (2013.01)

(58) Field of Classification Search
CPC .... G01R 27/02; G01R 9/0038; G01R 19/155; G01K 7/25; G01K 7/20; G01K 7/21; G03F 7/7085; G03F 7/70891
See application file for complete search history.

(56) References Cited

U.S. PATENT DOCUMENTS 5,351,101 A 9/1994 Janson, Jr.
6,573,978 B1 6/2003 McGuire, Jr.
(Continued)

FOREIGN PATENT DOCUMENTS

CN 109489853 A * 3/2019 ............. G01C 21/16
CN 112798130 A 5/2021
(Continued)

OTHER PUBLICATIONS

Computer translation of CN_109489853_A (Year: 2026).*
(Continued)

*Primary Examiner* — Randy W Gibson
(74) *Attorney, Agent, or Firm* — Fish & Richardson P.C.

(57) ABSTRACT

A temperature measuring device for measuring a temperature at or in an optical system of a lithography apparatus comprises: an activation source for generating a measurement current or a measurement voltage between a first and a second connection point of the activation source; a plurality of temperature resistors which comprise at a temperature resistor and a measurement temperature resistor, each temperature resistor between first and second line nodes; a first switching unit for selectively connecting the first connection point to a first line node; a voltage detection unit for detecting a voltage at the temperature resistors; a first line which electrically connects the second line node of the at least one reference temperature resistor and the second line node of the at least one measurement temperature resistor to a first connection point of the voltage detection unit; and a temperature determination unit.

20 Claims, 10 Drawing Sheets

(51) Int. Cl.

| | |
|---|---|
| ***G01R 19/155*** | (2006.01) |
| ***G01R 27/02*** | (2006.01) |

(56) References Cited

U.S. PATENT DOCUMENTS

| | | | |
|---|---|---|---|
| 2006/0132747 | A1 | 6/2006 | Singer et al. |
| 2010/0200777 | A1 | 8/2010 | Hauf |
| 2018/0074303 | A1 | 3/2018 | Schwab |
| 2020/0272058 | A1 | 8/2020 | Bieling et al. |
| 2020/0309606 | A1 | 10/2020 | Nomiya et al. |

FOREIGN PATENT DOCUMENTS

| | | | | | |
|---|---|---|---|---|---|
| CN | 120576895 | A | * | 9/2025 | ............... G01K 7/16 |
| DE | 4227149 | A1 | * | 2/1994 | ......... G01R 31/2829 |
| DE | 10 2008 009 600 | A1 | | 8/2009 | |
| DE | 10 2017 220 586 | A1 | | 5/2019 | |
| EP | 0 120 102 | A1 | | 10/1984 | |
| EP | 0 528 784 | A1 | | 2/1993 | |
| EP | 1 614 008 | B1 | | 12/2009 | |
| EP | 2 199 766 | A2 | | 6/2010 | |
| GB | 2541482 | A | | 2/2017 | |
| JP | 2017-021350 | A | | 1/2017 | |
| JP | 2020-159891 | A | | 10/2020 | |
| WO | WO 2019/162038 | A1 | | 8/2019 | |
| WO | WO-2025256988 | A1 | * | 12/2025 | ......... G03F 7/70891 |

OTHER PUBLICATIONS

Computer translation of DE_4227149_A1 (Year: 2026).*
Computer translation of CN_120576895_A (Year: 2026).*
Computer translation of EP_0120102_A (Year: 2026).*
Computer translation of WO_2025256988_A1 (Year: 2026).*
Translation of International Search Report for corresponding PCT Appl No. PCT/EP2022/072076, dated Jan. 19, 2023.
Written Opinion in International Appln. No. PCT/EP2022/072076, mailed on Jan. 19, 2023, 17 pages (with English translation).
Office Action in Korean Appln. No. 10-2024-7006548, mailed on Mar. 5, 2026, 18 pages (with English translation).

* cited by examiner

TEMPERATURE MEASURING DEVICE, LITHOGRAPHY APPARATUS AND METHOD FOR MEASURING A TEMPERATURE

CROSS-REFERENCE TO RELATED APPLICATIONS

The present application is a continuation of, and claims benefit under 35 USC 120 to, in-ternational application PCT/EP2022/072076, filed Aug. 5, 2022, which claims benefit under 35 USC 119 of German Application No. 10 2021 208 562.8, filed Aug. 6, 2021. The entire disclosure of each these applications is incorporated by reference herein.

FIELD

The present disclosure relates to a temperature measuring device for measuring a temperature at or in an optical system of a lithography apparatus. The present disclosure further relates to a lithography apparatus with such a temperature measuring device and to a method for measuring a temperature at or in an optical system of a lithography apparatus.

BACKGROUND

Microlithography is used for producing microstructured components, for example, integrated circuits. The microlithography process is carried out using a lithography apparatus, which has an illumination system and a projection system. The image of a mask (reticle) illuminated via the illumination system is projected here via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light having a wavelength in the range of 0.1 nm to 30 nm, in particular 13.5 nm. In the case of such EUV lithography apparatuses, because of the high absorption of light of this wavelength by most materials, reflective optical units, that is to say mirrors, are generally used instead of—as previously—refractive optical units, that is to say lens elements.

Temperature sensors can be used in various areas in lithography apparatuses. Such temperature sensors are used, for example, to quantify thermal deformations of mirrors due to an absorption of the radiation emitted by the EUV light source. The optical deformations of the mirror can lead to impairments in imaging via the projection lens. In order to counteract the aforementioned thermal deformations, a high-precision temperature measurement with an absolute precision of better than 50 mK, such as better than 5 mK, can be desired.

It is known to use heat resistors (heat-dependent or temperature-dependent resistors) for temperature measurement. These provide a temperature-dependent resistance from which the temperature is derivable. In order to enable high-precision temperature measurement and reduce the influence of errors, EP 0 120 102 A1 proposes a measuring apparatus in which reference resistors and measurement resistors are sequentially provided with current. A voltage at the individual resistors is tapped by two further switching units and used to determine a temperature with a high degree of precision. Voltage values at the reference resistors and voltage values at the measurement resistors are included in the temperature determination.

SUMMARY

In some cases, the multiplicity of lines used to connect resistors to switching units has proven to be detrimental.

The present disclosure to improve a measurement of a temperature at an optical system of a lithography apparatus.

According to a first aspect, a temperature measuring device for measuring a temperature at or in an optical system of a lithography apparatus is provided. The temperature measuring device has:

- a drive source for generating a measurement current or a measurement voltage between a first and a second connection point of the drive source;
- a plurality of temperature resistors comprising at least one reference temperature resistor and at least one measurement temperature resistor, wherein the temperature resistors are in each case arranged between a first and a second line node of a plurality of first and second line nodes;
- a first switching unit for optionally connecting the first connection point of the drive source to one or more of the first line nodes;
- a voltage recording unit for recording a voltage at the temperature resistors;
- a first line electrically connecting at least two of the second line nodes together to a first connection point of the voltage recording unit; and
- a temperature determination unit suitable for being communicatively coupled to the voltage recording unit to receive the voltage recorded by the voltage recording unit and to determine the temperature at or in the optical system based on the voltage received from the voltage recording unit.

The first line electrically connects in particular the second line node of the at least one reference temperature resistor and the second line node of the at least one measurement temperature resistor together to a first connection point of the voltage recording unit.

The use of a common first line can reduce the number of components used. For example, a plurality of temperature resistors can share a line for the voltage tap by way of the voltage recording unit, with the result that further lines and/or further switching units can be dispensed with. The inclusion of the voltage at the reference temperature resistor in the calculation of the temperature can also allow a more precise determination of the temperature at or in the optical system.

The lithography apparatus is, for example, a DUV lithography apparatus or an EUV lithography apparatus. In this case, DUV stands for "deep ultraviolet" and refers to a wavelength of the working light of between 30 and 250 nm. EUV stands for "extreme ultraviolet" and refers to a wavelength of the working light of between 0.1 and 30 nm.

The optical system may comprise an optical element (such as a mirror or lens element), a sensor and/or an actuator. The temperature measuring device, which can also be referred to as a "temperature measuring circuit," can be used for temperature measurement in any part of the lithography apparatus. The temperature measuring device can also be considered a temperature sensor. The temperature measuring device is used, for example, to measure a temperature at an optical element (for example, at a mirror or at a lens element) of the lithography apparatus, at an actuator or the like. The determination of the temperature can also be used in the diagnosis, especially in the determination of the aging, of the lithography apparatus.

The device for determining the temperature can be suitable, for example, for determining the temperature with a high level of precision. “High precision” refers to temperature measurements with an absolute precision of between 5 and 50 mK, such as between 5 and 20 mK. High-precision temperature measurements can be desirable in lithography because high-precision optical units can be provided thereby.

The drive source can be a current source or a voltage source. In particular, the current source is a DC current source. Alternatively, the current source can be an AC current source that provides, for example, a square wave signal or a sinusoidal wave signal. The measurement current output by the current source can be varied with an analog voltage signal from a digital-to-analog converter.

The temperature resistors (thermal resistors) are thermal resistors. An electrical resistance value of such a temperature resistor changes depending on a temperature at the temperature resistor. The temperature at the temperature resistor can thus be derived from the electrical resistance value. The German term “temperature resistor” here denotes a component (that is to say a temperature resistance element) rather than an abstract resistance in the form of a resistance value.

The temperature resistors can comprise at least one reference resistor and at least one measurement temperature resistor. The temperature resistors can comprise exactly one reference resistor and a plurality of measurement temperature resistors.

The temperature resistors can all be configured identically. Alternatively, the reference temperature resistors can be, for example, resistors of a first type, while the measurement temperature resistors are resistors of a second type. The at least one reference temperature resistor can be a resistor that allows a more precise temperature measurement than the measurement temperature resistors. With the measurement temperature resistors, lower demands can also be made on precision. The measurement temperature resistor(s) may be arranged at or in the optical system to detect the temperature there.

Each temperature resistor can be arranged between a first and a second line node, which line nodes this temperature resistor in particular does not share with any other temperature resistor. For example, provided are the same number of temperature resistors as there are first line nodes and second line nodes. For example, a line node is a point at which a plurality of line segments are connected to one another, or an end of a line.

The first switching unit can be a controllable circuit, for example a multiplexer. The first switching unit can be suitable for always electrically connecting exactly one of the temperature resistors to the drive source. In this case, the temperature resistors can be supplied with current individually and successively. In each switching state of the first switching unit, in particular exactly one temperature resistor is connected to the drive source. For this purpose, the first switching unit can provide an electrical connection between the first connection point of the drive source and in each case one of the first line nodes.

Alternatively, two or more temperature resistors can be simultaneously connected to the drive source by the first switching unit. For this purpose, the first switching unit can provide an electrical connection between the first connection point of the drive source and in each case a plurality of the first line nodes. In this case, a plurality of temperature resistors can be connected to the drive source in each switching state of the first switching unit.

The voltage recording unit may comprise a voltmeter and/or an analog-to-digital converter. The voltage recording unit is suitable for measuring the voltage that drops at the temperature resistor connected to the drive source. The voltage recording unit can be connected via a further switching unit, which can optionally switch synchronously to the previously described switching unit, in each case to the temperature resistor(s) which are currently connected to the drive source.

A line is understood to mean in the present case generally a stranded wire. The common first line is in particular a line that connects a plurality of temperature resistors together to the voltage recording unit. The first line can connect a plurality of second line nodes to the first connection point of the voltage recording unit. In connection with the first line, the terms “together” and “common” mean in particular that the first line simultaneously connects a plurality of second line nodes physically and electrically to the first connection point of the voltage recording unit. In other words, the first line can (simultaneously) provide a permanent electrical connection between the first connection point of the voltage recording unit and a plurality of second line nodes.

The common first line can be a directly connecting line in which no controllable circuit is arranged which switches between the plurality of second line nodes to be connected. For example, the voltage recording unit can record the voltage at a plurality of temperature resistors without having to switch between a plurality of measurement states.

The use of a common first line can reduce the number of components used. For example, a plurality of line nodes can share a line for voltage tapping, so that additional lines are omitted. Only a first line is used because the first switching unit switches between the temperature resistors and therefore only one or more temperature resistors are supplied with current at a time. The voltage recording unit records the voltage of exactly the temperature resistor(s) that are supplied with current, without the need for separate lines. Further switching units can also be dispensed with.

The temperature determination unit can be a processor or the like. The temperature determination unit can be used to evaluate the voltage values recorded by the voltage recording unit in order to determine therefrom the temperature in or at the optical system. In particular, the temperature determination unit can calculate the resistance value at the measurement temperature resistors from the voltage values of the voltage recording unit. Using a pre-stored resistance-temperature characteristic, a lookup table, or a pre-stored function that provides a reference between the resistance value and the temperature, the temperature determination unit can determine the temperature in or at the optical system. By taking the voltage at the reference temperature resistor into account, for example gain errors in the voltage recording unit can be canceled out.

According to one embodiment, the temperature determination unit is suitable for:

- calculating a resistance value of the measurement temperature resistor in dependence on a measurement voltage recorded by the voltage recording unit at the measurement temperature resistor and a reference voltage recorded by the voltage recording unit at the reference temperature resistor; and
- determining the temperature at or in the optical system based on the calculated resistance value.

When determining the temperature, the temperature determination unit can optionally take into account both the voltage that drops at the reference temperature resistor and the voltage that drops at the measurement temperature resistor, and calculates the temperature, for example, ratiometrically. This can increase the absolute precision of the temperature measurement.

The temperature determination unit can be suitable for determining the temperature using a measurement voltage and a reference voltage that were recorded in the same switching cycle of the first switching unit.

According to a further embodiment, the temperature measuring device has a plurality of measurement temperature resistors.

"A plurality" means in particular at least two. It can be desirable to provide a plurality of measurement temperature resistors in that the precision of the temperature determination can be increased, for example by the temperature determination unit calculating an average value by way of the temperatures measured by the individual measurement temperature resistors.

According to an embodiment, the first line connects all the second line nodes of the measurement temperature resistors together to the first connection point of the voltage recording unit.

It can be desirable for the number of lines to be reduced here.

According to an embodiment, the temperature measuring device further comprises a printed circuit board on which the drive source, the voltage recording unit, the temperature determination unit, and an interface unit for connecting the first line are arranged.

The printed circuit board can be a printed circuit board on or to which the individual named components are plugged, bonded and/or soldered. The printed circuit board can form a module that can be used as a whole. The interface unit may also be suitable for connecting at least one second line, which electrically connects the printed circuit board to the at least one measurement temperature resistor.

According to an embodiment, the printed circuit board further comprises the first switching unit and/or the reference temperature resistor.

According to an embodiment, the temperature measuring device further comprises:

- a second switching unit for optionally connecting the first connection point of the voltage recording unit to a plurality of the second line nodes, wherein the first and the second switching units are at least partially differently clocked.

The first and second switching units can be at least partially clocked differently and/or switch in different sequences between different states. The first and second switching units can switch back and forth between the individual temperature resistors in such a way that the voltage is measured at only exactly one temperature resistor supplied with the measurement current by the voltage recording unit. This can allow a large number of temperature resistors to be arranged with a reduced number of components used.

In some embodiments, the temperature measuring device is suitable for reversing the current direction of the measurement current. By differential measuring of the voltage recording unit (before and after the current direction reversal), offset errors of the voltage recording unit can thus be removed by calculation.

According to a second aspect, a lithography apparatus is provided. The lithography apparatus comprises a temperature measuring device according to the first aspect or according to an embodiment of the first aspect and an optical system having a mirror, a lens element and/or an actuator for a mirror or a lens element, wherein the at least one measurement temperature resistor is arranged at or in the optical system.

The embodiments and features described for the temperature measuring device apply mutatis mutandis to the proposed lithography apparatus and vice versa.

According to an embodiment, the lithography apparatus further comprises:

- a first closed area in which the optical system and the at least one measurement temperature resistor are arranged;
- a second closed area, spatially separated from the first closed area, in which the drive source and the voltage recording unit are arranged; and
- connecting lines which electronically connect the first closed area and the second closed area such that the drive source supplies the measurement temperature resistor with current or a voltage, wherein the connecting lines comprise at least the first line.

The two closed areas can be arranged at a distance of several meters from each other, in particular of more than twenty meters. "Closed" in particular means that the areas are formed in housings and are delimited thereby. The connecting lines are used in particular for the electrical coupling of the two areas.

According to an embodiment, there is a vacuum in the first closed area and there is no vacuum in the second closed area.

According to an embodiment:

- the at least one reference temperature resistor and/or the first switching unit is arranged in the first closed area; or
- the at least one reference temperature resistor and/or the first switching unit is arranged in the second closed area.

According to a third aspect, provided is a method for measuring a temperature in or at an optical system of a lithography apparatus, in particular with a temperature measuring device according to the first aspect or according to an embodiment of the first aspect, using a plurality of temperature resistors comprising at least one reference temperature resistor and at least one measurement temperature resistor, wherein the temperature resistors are arranged respectively between a first and a second line node from a plurality of first and second line nodes. The method comprises:

- generating a measurement current between a first and a second connection point of a drive source;
- optionally connecting, with a switching unit, a first connection point of the drive source to one or more of the first line nodes;
- recording a voltage at the temperature resistors with a voltage recording unit;
- electrically connecting, with a first line, at least two of the second line nodes together to a first connection point of the voltage recording unit; and
- determining the temperature at or in the optical system based on the voltage recorded by the voltage recording unit.

The embodiments and features described for the temperature measuring device and for the lithography apparatus apply mutatis mutandis to the proposed method and vice versa.

The second line node of the at least one reference temperature resistor and the second line node of the at least one measurement temperature resistor can be electrically connected together, with a first line, to a first connection point of the voltage recording unit.

"A(n)" should not necessarily be understood as being restricted to exactly one element here. Rather, a plurality of elements, such as two, three or more, may be provided. Nor should any other numeral used here be understood to the effect that there is a restriction to exactly the stated number of elements. Instead, unless indicated otherwise, numerical deviations upward and downward are possible.

Further possible implementations of the disclosure also comprise non-explicitly mentioned combinations of features or embodiments described previously or hereafter with regard to the exemplary embodiments. In this case, a person skilled in the art will also add individual aspects as improvements or supplementations to the respective basic form of the disclosure.

Further refinements and aspects of the disclosure are the subject matter of the dependent claims and also of the exemplary embodiments of the disclosure that are described below. The disclosure is explained in greater detail hereinafter on the basis of embodiments with reference to the accompanying figures.

DETAILED DESCRIPTION

Figure 1:
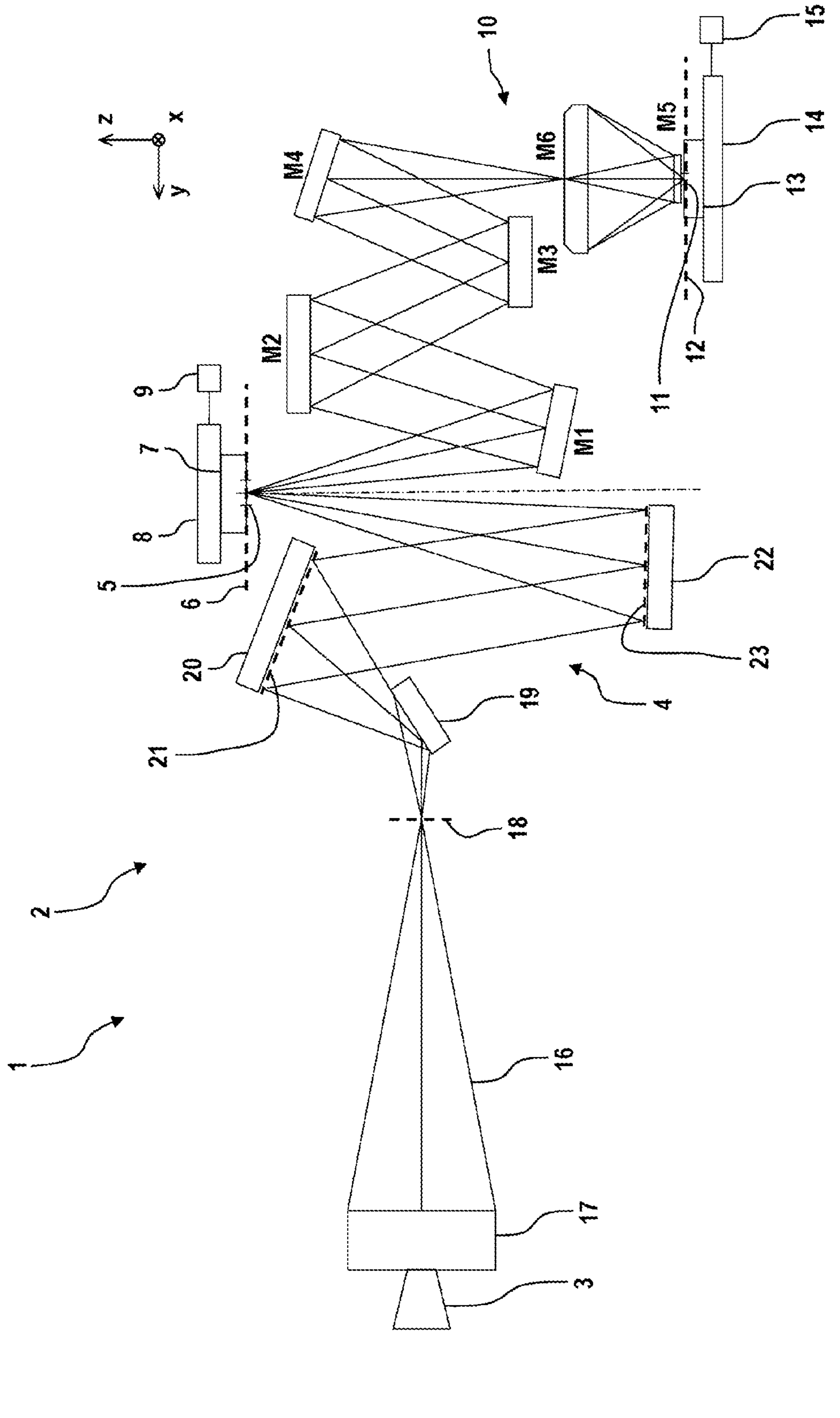
FIG. 1 schematically shows a projection exposure apparatus for EUV projection lithography in a meridional section.

Unless indicated otherwise, elements that are identical or functionally identical have been provided with the same reference signs in the figures. It should also be noted that the illustrations in the figures are not necessarily true to scale.

An embodiment of an illumination system 2 of the projection exposure apparatus (lithography apparatus) 1 has, in addition to a light or radiation source 3, an illumination optical unit 4 for illuminating an object field 5 in an object plane 6. In an alternative embodiment, the light source 3 may also be provided as a module separate from the rest of the illumination system. In this case, the illumination system 2 does not comprise the light source 3.

A reticle 7 arranged in the object field 5 is exposed. The reticle 7 is held by a reticle holder 8. The reticle holder 8 is displaceable, in particular in a scanning direction, by way of a reticle displacement drive 9.

FIG. 1 shows a Cartesian xyz coordinate system by way of elucidation. The x-direction runs perpendicular to the plane of the drawing. The y-direction runs horizontally, and the z-direction runs vertically. The scanning direction runs in the y-direction in FIG. 1. The z-direction runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6.

Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable, in particular in the y-direction, by way of a wafer displacement drive 15. The displacement firstly of the reticle 7 by way of the reticle displacement drive 9 and secondly of the wafer 13 by way of the wafer displacement drive 15 can be implemented so as to be mutually synchronized.

The radiation source 3 is an EUV radiation source. The radiation source 3 emits, in particular, EUV radiation 16, which is also referred to below as used radiation, illumination radiation or illumination light. In particular, the used radiation has a wavelength in the range between 5 nm and 30 nm. The radiation source 3 may be a plasma source, for example an LPP (laser produced plasma) source or a GDPP (gas discharge produced plasma) source. It may also be a synchrotron-based radiation source. The radiation source 3 may be a free electron laser (FEL).

The illumination radiation 16 emanating from the radiation source 3 is focused by a collector 17. The collector 17 may be a collector with one or more ellipsoidal and/or hyperboloid reflection surfaces. The illumination radiation 16 may be incident on the at least one reflection surface of the collector 17 with grazing incidence (GI), i.e. at angles of incidence of greater than 45°, or with normal incidence (NI), i.e. at angles of incidence of less than 45°. The collector 17 may be structured and/or coated, firstly to optimize its reflectivity for the used radiation and secondly to suppress extraneous light.

Downstream of the collector 17, the illumination radiation 16 propagates through an intermediate focus in an intermediate focal plane 18. The intermediate focal plane 18 may represent a separation between a radiation source module, having the radiation source 3 and the collector 17, and the illumination optical unit 4.

The illumination optical unit 4 comprises a deflection mirror 19 and, downstream thereof in the beam path, a first facet mirror 20. The deflection mirror 19 can be a plane deflection mirror or, alternatively, a mirror with a beam-influencing effect that goes beyond the purely deflecting effect. As an alternative or in addition, the deflection mirror 19 may be designed as a spectral filter that separates a used light wavelength of the illumination radiation 16 from extraneous light of a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. FIG. 1 depicts only some of the facets 21 by way of example.

The first facets 21 can be embodied as macroscopic facets, in particular as rectangular facets or as facets with an arcuate or partly circular peripheral contour. The first facets 21 may be embodied as plane facets or alternatively as convexly or concavely curved facets.

As is known for example from DE 10 2008 009 600 A1, the first facets 21 themselves may also each be composed of a multiplicity of individual mirrors, in particular a multiplicity of micromirrors. The first facet mirror 20 may in particular be in the form of a microelectromechanical system (MEMS system). For details, reference is made to DE 10 2008 009 600 A1.

The illumination radiation 16 travels horizontally, which is to say in the y-direction, between the collector 17 and the deflection mirror 19.

In the beam path of the illumination optical unit 4, a second facet mirror 22 is arranged downstream of the first facet mirror 20. Provided the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or hexagonal boundary, or may alternatively be facets composed of micromirrors. In this regard, reference is likewise made to DE 10 2008 009 600 A1.

The second facets 23 can have plane or, alternatively, convexly or concavely curved reflection surfaces.

The illumination optical unit 4 thus forms a double-faceted system. This fundamental principle is also referred to as a fly's eye integrator.

It may be desirable to arrange the second facet mirror 22 not exactly in a plane that is optically conjugate to a pupil plane of the projection optical unit 10. In particular, the pupil facet mirror 22 may be arranged so as to be tilted relative to a pupil plane of the projection optical unit 7, as described, for example, in DE 10 2017 220 586 A1.

The individual first facets 21 are imaged into the object field 5 using the second facet mirror 22. The second facet mirror 22 is the last beam-shaping mirror or indeed the last mirror for the illumination radiation 16 in the beam path upstream of the object field 5.

In a further embodiment (not illustrated) of the illumination optical unit 4, a transfer optical unit may be arranged in the beam path between the second facet mirror 22 and the object field 5, and contributes in particular to the imaging of the first facets 21 into the object field 5. The transfer optical unit may have exactly one mirror or, alternatively, two or more mirrors, which are arranged in succession in the beam path of the illumination optical unit 4. The transfer optical unit can in particular comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20, and the pupil facet mirror 22.

The deflection mirror 19 may also be omitted in a further embodiment of the illumination optical unit 4, and so the illumination optical unit 4 may then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve, or any other number of mirrors Mi are likewise possible. The projection optical unit 10 is a doubly obscured optical unit. The penultimate mirror M5 and the last mirror M6 each have a through opening for the illumination radiation 16. The projection optical unit 10 has an image-side numerical aperture that is greater than 0.5 and may also be greater than 0.6 and may be for example 0.7 or 0.75.

Reflection surfaces of the mirrors Mi may be designed as freeform surfaces without an axis of rotational symmetry. Alternatively, the reflection surfaces of the mirrors Mi may be designed as aspherical surfaces with exactly one axis of rotational symmetry of the reflection surface shape. Just like the mirrors of the illumination optical unit 4, the mirrors Mi may have highly reflective coatings for the illumination radiation 16. These coatings may be designed as multilayer coatings, in particular with alternating layers of molybdenum and silicon.

The projection optical unit 10 has a large object-image offset in the y-direction between a y-coordinate of a center of the object field 5 and a y-coordinate of the center of the image field 11. In the y-direction, this object-image offset can be of approximately the same magnitude as a z-distance between the object plane 6 and the image plane 12.

The projection optical unit 10 may in particular have an anamorphic form. In particular, it has different imaging scales $\beta x$, $\beta y$ in the x- and y-directions. The two imaging scales $\beta x$, $\beta y$ of the projection optical unit 10 can lie at $(\beta x, \beta y)=(+/-0.25, +/-0.125)$. A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction, which is to say in a direction perpendicular to the scanning direction.

The projection optical unit 10 leads to a reduction in size of 8:1 in the y-direction, which is to say in the scanning direction.

Other imaging scales are likewise possible. Imaging scales with the same signs and the same absolute values in the x-direction and y-direction, for example with absolute values of 0.125 or 0.25, are also possible.

The number of intermediate image planes in the x-direction and in the y-direction in the beam path between the object field 5 and the image field 11 may be the same or may differ depending on the embodiment of the projection optical unit 10. Examples of projection optical units with different numbers of such intermediate images in the x- and y-directions are known from US 2018/0074303 A1.

One of the pupil facets 23 in each case is assigned to exactly one of the field facets 21, in each case to form an illumination channel for illuminating the object field 5. This may in particular result in illumination according to the Kohler principle. The far field is deconstructed into a multiplicity of object fields 5 with the aid of the field facets 21. The field facets 21 generate a plurality of images of the intermediate focus on the pupil facets 23 respectively assigned thereto.

The field facets 21 are imaged each by way of an assigned pupil facet 23 onto the reticle 7 in a manner such that they are mutually superposed for the illumination of the object field 5. The illumination of the object field 5 is in particular as homogeneous as possible. It can have a uniformity error of less than 2%. Field uniformity can be achieved by superposing different illumination channels.

The illumination of the entrance pupil of the projection optical unit 10 may be geometrically defined by an arrangement of the pupil facets. It is possible to set the intensity distribution in the entrance pupil of the projection optical unit 10 by selecting the illumination channels, in particular the subset of pupil facets which guide light. This intensity distribution is also referred to as illumination setting or illumination pupil filling.

A likewise preferred pupil uniformity in the region of portions of an illumination pupil of the illumination optical unit 4 which are illuminated in a defined manner may be achieved by a redistribution of the illumination channels.

Further aspects and details of the illumination of the object field 5 and in particular of the entrance pupil of the projection optical unit 10 are described hereinafter.

The projection optical unit 10 may in particular have a homocentric entrance pupil. The latter may be accessible. It may also be inaccessible.

The entrance pupil of the projection optical unit 10 generally cannot be illuminated exactly via the pupil facet mirror 22. The aperture rays often do not intersect at a single point when imaging the projection optical unit 10 which telecentrically images the center of the pupil facet mirror 22 onto the wafer 13. However, it is possible to find an area in which the spacing of the aperture rays, determined in pairwise fashion, is minimal. This area represents the entrance pupil or an area in real space that is conjugate thereto. In particular, this area has a finite curvature.

It may be the case that the projection optical unit 10 has different poses of the entrance pupil for the tangential beam path and for the sagittal beam path. In this case, an imaging element, in particular an optical component of the transfer optical unit, should be provided between the second facet mirror 22 and the reticle 7. With the aid of this optical element, the different poses of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is in a tilted arrangement with respect to the object plane 6. The first facet mirror 20 is in a tilted arrangement with respect to an arrangement plane defined by the deflection mirror 19. The first facet mirror 20 is in a tilted arrangement with respect to an arrangement plane defined by the second facet mirror 22.

Figure 2:
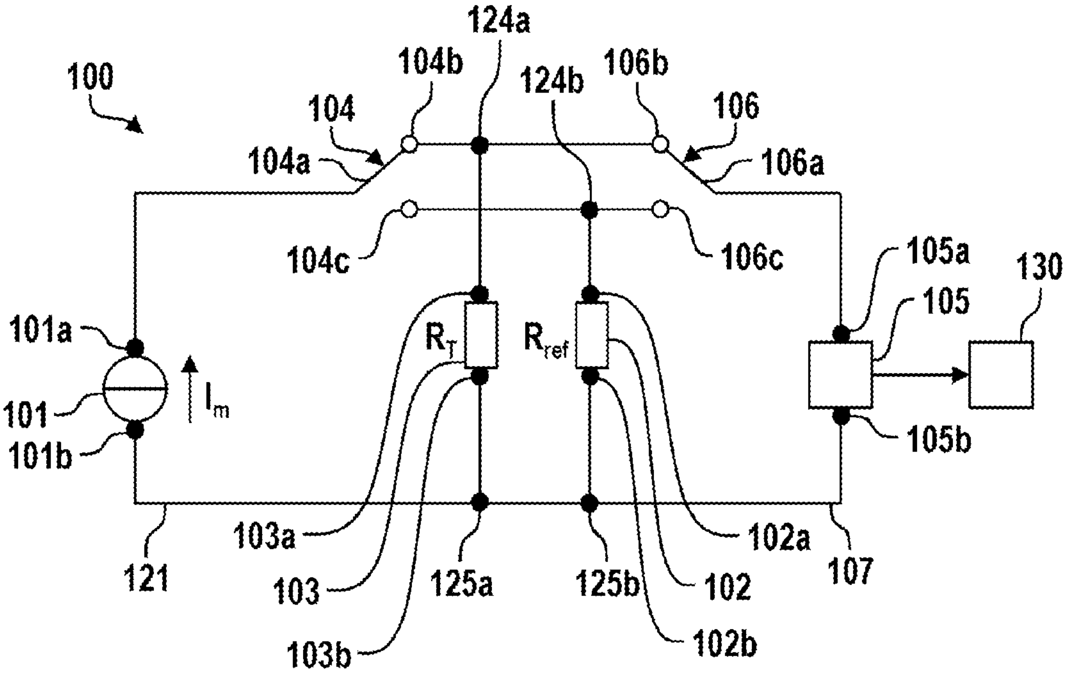
FIG. 2 shows a temperature measuring device according to a first embodiment.

FIG. 2 shows a temperature measuring device 100 according to a first embodiment. The temperature measuring device 100 is arranged in the lithography apparatus 1 of FIG. 1 and serves for measuring a temperature of an optical surface of the facet mirror 20. For this purpose, a measurement temperature resistor 103 with a measurement resistance value $R_T$ is used, which is arranged on a rear side of the facet mirror 20.

In addition to the measurement temperature resistor 103, the temperature measuring device 100 further comprises a reference temperature resistor 102 with a reference resistance value $R_{ref}$, a current source 101 as an example of a drive source, a first switching unit 104, and a voltage recording unit 105. The current source 101 is a DC current source that supplies a current $I_m$ at its connection points 101*a*, 101*b*. The connection points 101*a*, 101*b* of the current source 101 are also referred to as the first connection point 101*a* and the second connection point 101*b*. The reference temperature resistor 102 is electrically connected to a first line node 124*a* and to a second line node 125*a*. The measurement temperature resistor 103 is electrically connected to a first line node 124*b* and to a second line node 125*b*.

For electrically connecting the individual components of the temperature measuring device 100, in particular the individual line nodes 124*a*, 124*b*, 125*a*, 125*b*, and the connection points 101*a*, 101*b*, 102*a*, 102*b*, 103*a*, 103*b*, 105*a*, 105*b*, lines (strands) are used, of which only some lines described in more detail below have been provided with reference signs.

The first switching unit 104 is designed as a multiplexer. It is arranged in a current path between the connection point 101*a* of the current source 101 and the temperature resistors 102, 103, more precisely between the connection point 101*a* of the current source 101 and the first line nodes 124*a*, 124*b*. The first switching unit 104 can switch between two states.

In a first state, which is shown in FIG. 2, the first switching unit 104 electrically connects the current source 101 and the measurement temperature resistor 103. In doing so, the first switching unit 104 closes a current path between the connection point 101*a* of the current source 101 and the first line node 124*a* by virtue of the switching unit 104 connecting its switching element 104*a* to a first switching point 104*b*. In a second state, which is not shown in FIG. 2, the first switching unit 104 connects the current source 101 and the reference temperature resistor 102. In doing so, the first switching unit 104 closes a current path between the connection point 101*a* of the current source 101 and the first line node 124*b* by virtue of the switching unit 104 connecting its switching element 104*a* to a second switching point 104*c*.

In the first state, the current path between the current source 101 and the reference temperature resistor 102 is interrupted. In the second state, the current path between the current source 101 and the measurement temperature resistor 103 is interrupted. For example, the switching frequency of the switching unit 104 is 10 Hz.

In both states, the second line node 125*a* is electrically connected to a second connection point 101*b* of the current source 101. Furthermore, the second line node 125*b* is electrically connected in both states to the second connection point 101*b* of the current source 101. The connection of the second connection point 101*b* to the second line nodes 125*a*, 125*b* is effected via a common line 121.

To record a voltage dropping at the temperature resistors 102, 103, a voltage recording unit 105 is connected to the line nodes 124*a*, 124*b*, 125*a*, 125*b* of the temperature resistors 102, 103. Between the first line nodes 124*a*, 124*b* and a connection point 105*a* of the voltage recording unit 105, a further switching unit 106 (multiplexer) is arranged, which switches back and forth simultaneously with the switching unit 104 between the temperature resistors 102, 103.

While the switching unit 104 is in the first state described above, the further switching unit 106 is in a state shown in FIG. 2, in which the voltage recording unit 105 is electrically connected to the measurement temperature resistor 103. The further switching unit 106 closes a current path between the line node 124a of the measurement temperature resistor 103 and the connection point 105a of the voltage recording unit 105. In doing so, the further switching unit 106 sets its switching element 106a to a first switching point 106b. The other line node 125a of the measurement temperature resistor 103 is connected to a further connection point 105b ("first connection point") of the voltage recording unit 105 so that the voltage recording unit 105 measures a voltage dropping at the measurement temperature resistor 103.

While the first switching unit 104 is in the second state described above, the further switching unit 106 is in a state not shown in FIG. 2, in which the voltage recording unit 105 is connected to the reference temperature resistor 102. The further switching unit 106 closes a current path between the line node 124b of the reference temperature resistor 103 and the connection point 105a of the voltage recording unit 105. In doing so, the further switching unit 106 sets its switching element 106a to a second switching point 106c. The other line node 125b of the reference temperature resistor 103 is connected to the further connection point 105b of the voltage recording unit 105 so that the voltage recording unit 105 measures a voltage dropping at the reference temperature resistor 102.

The voltage values measured by the voltage recording unit 105 are transmitted to a temperature determination unit 130. The temperature determination unit 130 determines the resistance value $R_T$ at the measurement temperature resistor 103 from the dropping voltage measured at the measurement temperature resistor 103. In order to determine a more precise resistance value $R_T$, the temperature determination unit 130 further takes into account the voltage dropping at the reference temperature resistor 102. The equation $R_T=(C_T*R_{ref})/C_{ref}$ applies, where $C_{ref}$ refers to the voltage dropping at the reference temperature resistor 102 and $C_T$ refers to the voltage dropping at the measurement temperature resistor 103. By taking into account the voltage dropping at the reference temperature resistor 102 when calculating the resistance value $R_T$, error entries that affect both measurements $C_{ref}$ and $C_T$ are canceled out (ratiometric principle). Such error entries affect in particular the offset and gain error. The resistance value $R_T$ can thus be calculated more precisely. The temperature determination unit 130 determines a temperature from the resistance value $R_T$ by using a pre-stored temperature resistor characteristic.

The temperature resistors 102, 103 have a common first line 107. In the exemplary embodiment of FIG. 2, the common first line 107 extends from the line node 125a to the connection point 105b of the voltage recording unit 105. The common line 107 thus connects both second line nodes 125a, 125b to the connection point 105b. The common first line 107 connects the temperature resistors 102, 103 together to the voltage recording unit 105, without requiring a further controllable circuit (switching unit). The connection points 102b, 103b of the temperature resistors 102, 103 are always connected to the connection point 105b of the voltage recording unit 105, regardless of the current switching states of the switching units 104, 106. The common first line 107 means that fewer components are used: fewer lines and fewer switching units are used.

Figure 3:
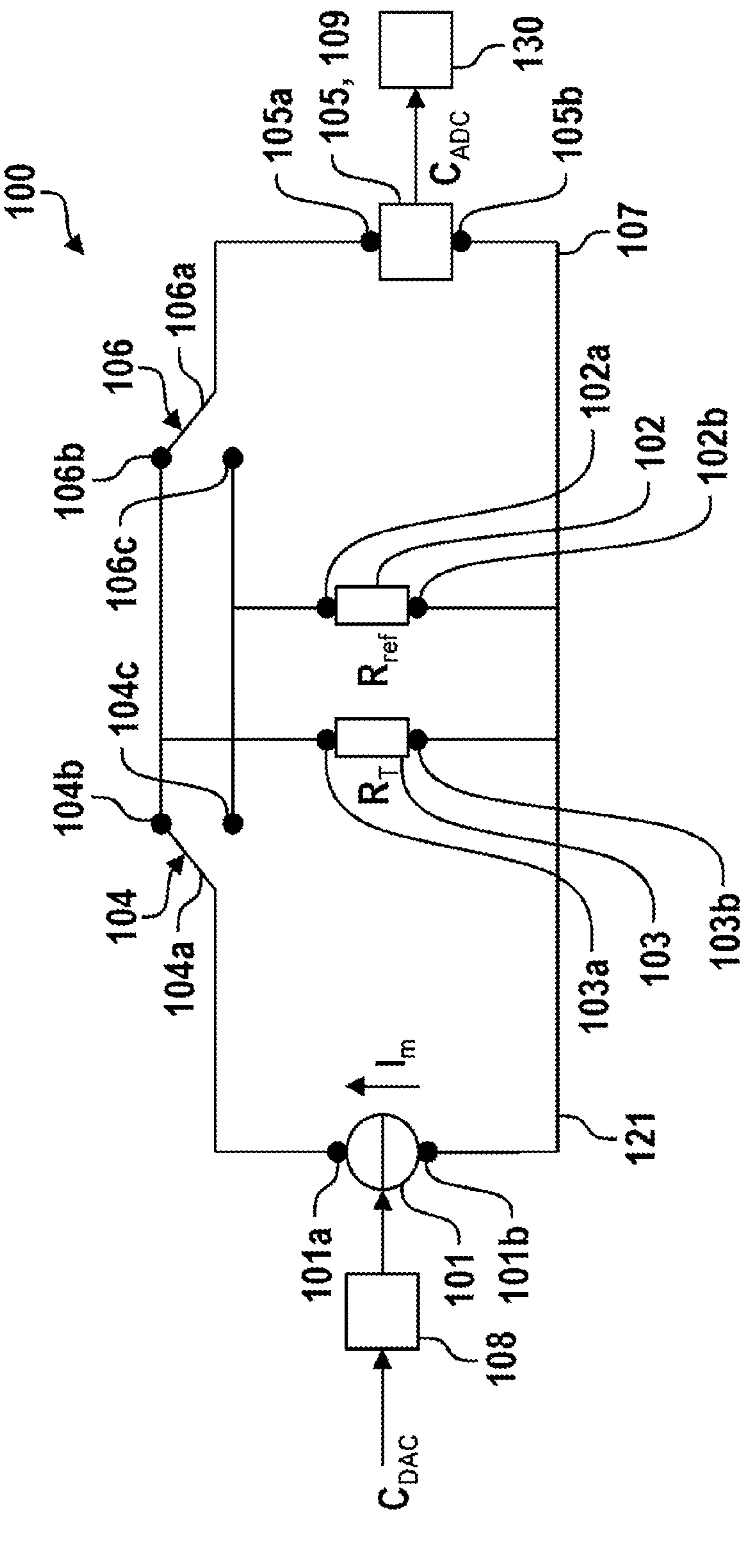
FIG. 3 shows a temperature measuring device according to a second embodiment.

FIG. 3 shows a temperature measuring device 100 according to a second embodiment. The temperature measuring device 100 of the second embodiment (FIG. 3) is largely identical to the temperature measuring device 100 of the first embodiment (FIG. 2). Mainly the differences compared with the first embodiment are therefore described below. For the aspects of the second embodiment which are not described below, it can be assumed that they are identical to those of the first embodiment.

The temperature device 100 of FIG. 3 comprises, in addition to the elements already described in connection with FIG. 2, a digital-to-analog converter 108 and an analog-to-digital converter 109. The digital-to-analog converter 108 receives a digital input voltage $C_{DAC}$ and converts it into an analog signal. This analog signal is used to control the current source 101 in order to supply a measurement signal with current $I_m$.

The analog-to-digital converter 109 can be coupled to the voltage recording unit 105 or be formed together therewith. In the example of FIG. 3, the analog-to-digital converter 109 forms the voltage recording unit 105. The analog-to-digital converter 109 converts the analog voltage that drops at the connected temperature resistor 102, 103 into a digital signal and outputs it as an output signal $C_{ADC}$. The output signal $C_{ADC}$ corresponds to the voltages $C_T$ and $C_{ref}$ described above. The output signal $C_{ADC}$ is transmitted to the temperature determination unit 130 for determining the temperature.

Background for the formula $R_T=(C_T*R_{ref})/C_{ref}$ (formula 1), which uses the temperature determination unit 130 for determining the temperature, is as follows. The transfer function from the digital-to-analog converter 108 to the analog-to-digital converter 109 in the calibration phase with the reference temperature resistor 102 is: $C_{ADC1}/(2\hat{}n)$ $(C_{DAC}*G*R_{ref})/(2\hat{}m)$ (formula 2), where G is the transfer function of the voltage-controlled current source 101, m is the number of bits of the digital-to-analog converter 108, and n is the number of bits of the analog-to-digital converter 109. When the switching unit connects the measurement temperature resistor 103, the measurement current $C_{DAC}*G/(2\hat{}m)$ flows through the measurement temperature resistor 103. The transfer function is then: $C_{ADC2}/(2\hat{}n)=(C_{DAC}*G*R_T)/(2\hat{}m)$ (formula 3). By resolving for $C_{DAC}*G/(2\hat{}m)$ and equating the formulas 2 and 3, formula 1 is obtained.

Figure 4:
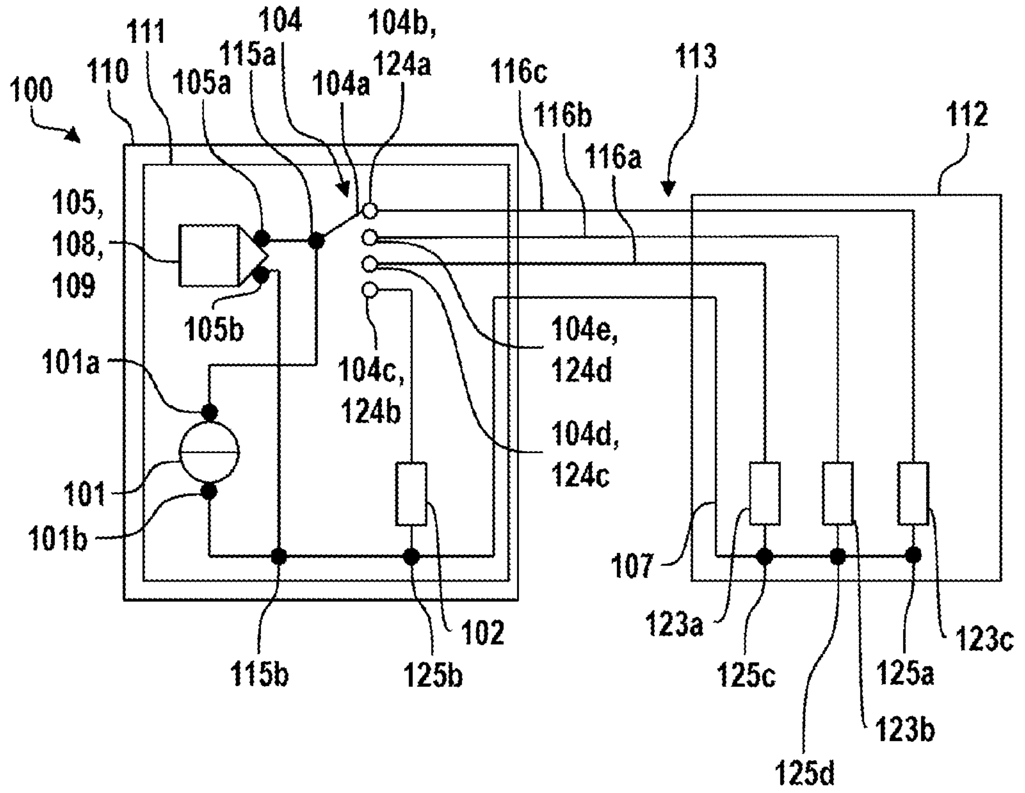
FIG. 4 shows a temperature measuring device according to a third embodiment.

FIG. 4 shows a temperature measuring device 100 according to a third embodiment. The temperature measuring device 100 of the third embodiment (FIG. 4) is largely identical to the temperature measuring devices 100 of the first and second embodiments (FIGS. 2 and 3). Mainly the differences compared with the first and second embodiments are therefore described below. For the aspects of the third embodiment which are not described below, it can be assumed that they are identical to those of the first and second embodiments.

FIG. 4 shows the arrangement of the temperature measuring device 100 in the lithography apparatus 1. A first part of the temperature measuring device 100 is arranged on a temperature measurement circuit board (printed circuit board) 111 in a housing 110 (first closed area) of the lithography apparatus 1. The housing 110 is not in a vacuum environment. A second part of the temperature measuring device 100 is arranged in a vacuum container 112 (second closed area) in a vacuum environment. For connecting the two environments 110, 112, a vacuum cable 113 is used, which has a length of between 20 and 30 m and comprises, among other things, the first line 107.

The temperature measurement circuit board 111 is a printed circuit board on which the current source 101, the reference temperature resistor 102, the switching unit 104, and a control unit comprising the voltage recording unit 105, the digital-to-analog converter 108 and the analog-to-digital converter 109 are arranged. Three measurement temperature resistors 123a-123c are arranged in the vacuum container 112. The switching and measurement principle is the same in FIG. 4 as in FIGS. 1 and 2, wherein the switching unit 104, however, can switch sequentially between four states, in which a temperature resistor 102, 123a-123c is connected in each case to the current source 101. In the four states, the switching unit 104 switches its switching element 104a between the switching points 104b-104e. In the example of FIG. 4, the first line nodes 124a-124d of the temperature resistors 102, 123a-123c act with the switching points 104b-104e of the switching unit 104.

In FIG. 4, the further switching unit 106 is omitted because the current source 101 and the control unit 105, 108, 109 upstream of the switching unit 104 are connected to each other via line nodes 115a, 115b. The temperature determination unit 130 is not shown in FIG. 4. In the exemplary embodiment of FIG. 4, the three measurement temperature resistors 123a-123c have a common first line 107. The latter extends between the second line node 125a, via the line nodes 125b-125d of the further temperature resistors 102, 123a, 123b, to the connection point 105b of the voltage recording unit 105 and is at least in sections part of the vacuum cable 113. Since the three measurement temperature resistors 123a-123c have a common first line 107, many meters of lines are saved.

For three measurement temperature resistors 123a-123c, only four lines 107, 116a-116c are used. The lines 116a-116c form supply lines for the three measurement temperature resistors 123a-123c, and the line 107 forms a common return line for the three measurement temperature resistors 123a-123c. In the case of a number of n measurement temperature resistors 103, 123a-123c, only n+1 lines are used for the n measurement temperature resistors 103, 123a-123c in an arrangement according to FIG. 4.

Figure 5:
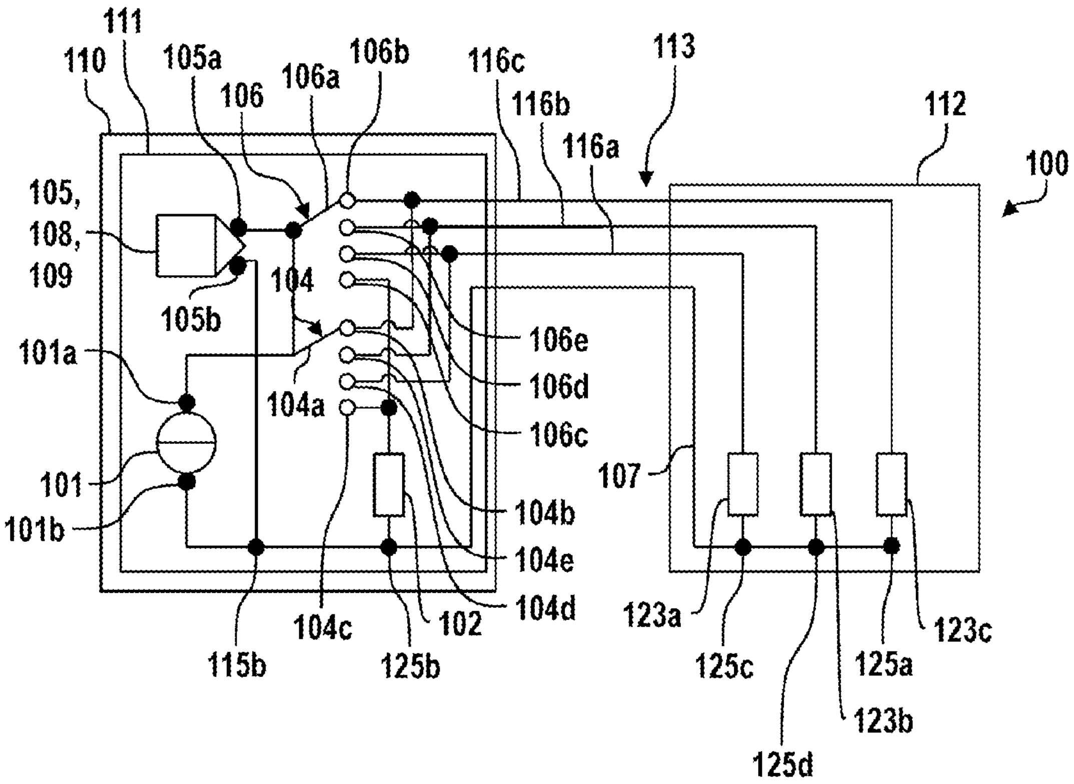
FIG. 5 shows a temperature measuring device according to a fourth embodiment.

FIG. 5 shows a temperature measuring device 100 according to a fourth embodiment. The temperature measuring device 100 of the fourth embodiment (FIG. 5) is largely identical to the temperature measuring device 100 of the third embodiment (FIG. 4). Mainly the differences compared with the third embodiment are therefore described below. For the aspects of the fourth embodiment which are not described below, it can be assumed that they are identical to those of the third embodiment.

The temperature measuring device 100 of FIG. 5 comprises, in addition to the temperature measuring device 100 of FIG. 4, a further switching unit 106 (multiplexer), the function and arrangement of which correspond to those of the further switching unit 106 of FIGS. 1 and 2, wherein the further switching unit 106 of FIG. 5, however, can switch between four states synchronously to the switching unit 104. The switching element 106a switches here between switching points 106b-106e. The provision of the further switching unit 106 means that the two switching units 104, 106 can cancel out their faults between each other, as a result of which a switching unit error is reduced and a more precise temperature determination is made possible.

Figure 6:
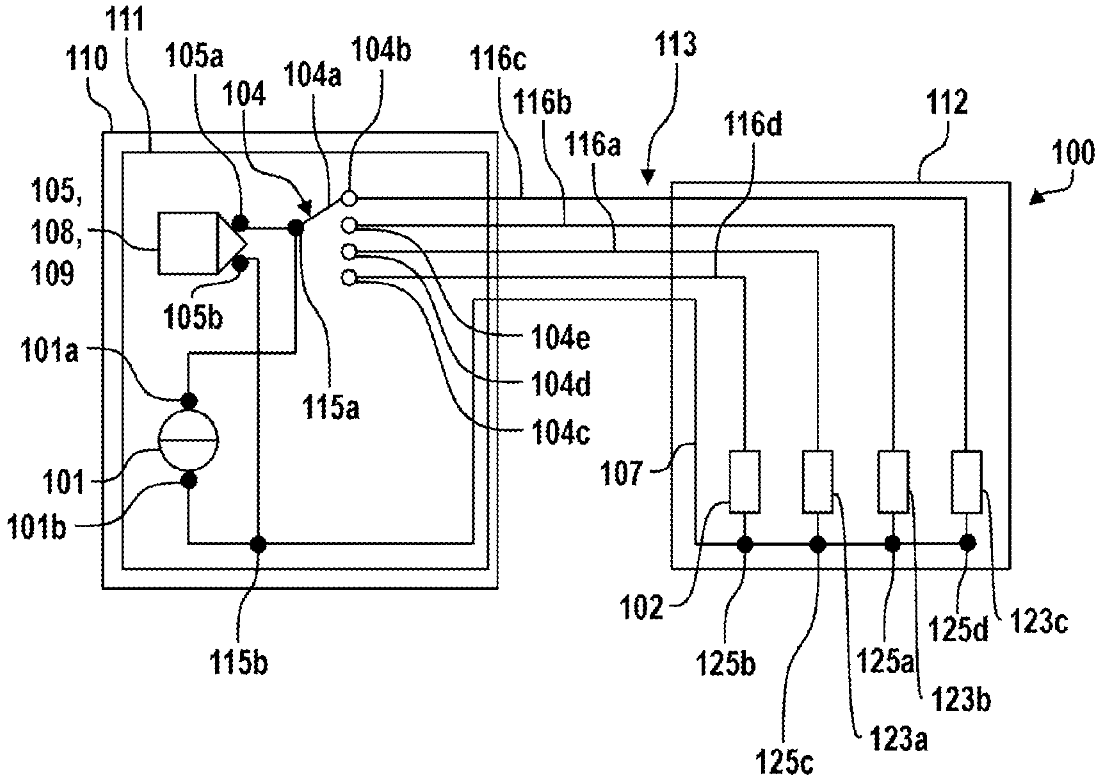
FIG. 6 shows a temperature measuring device according to a fifth embodiment.

FIG. 6 shows a temperature measuring device 100 according to a fifth embodiment. The temperature measuring device 100 of the fifth embodiment (FIG. 6) is largely identical to the temperature measuring device 100 of the third embodiment (FIG. 4). Mainly the differences compared with the third embodiment are therefore described below. For the aspects of the fifth embodiment which are not described below, it can be assumed that they are identical to those of the third embodiment.

In contrast to the third embodiment, the reference temperature resistor 102 in FIG. 6 is arranged in the vacuum container 112. The reference temperature resistor 102 thus shares a larger part of the common first line 107 with the measurement temperature resistors 123a-123c. In the embodiment of FIG. 6, errors in return lines of the temperature resistors 102, 123a-123c can cancel each other out because the temperature resistors 102, 123a-123c share a common return line 107.

Figure 7:
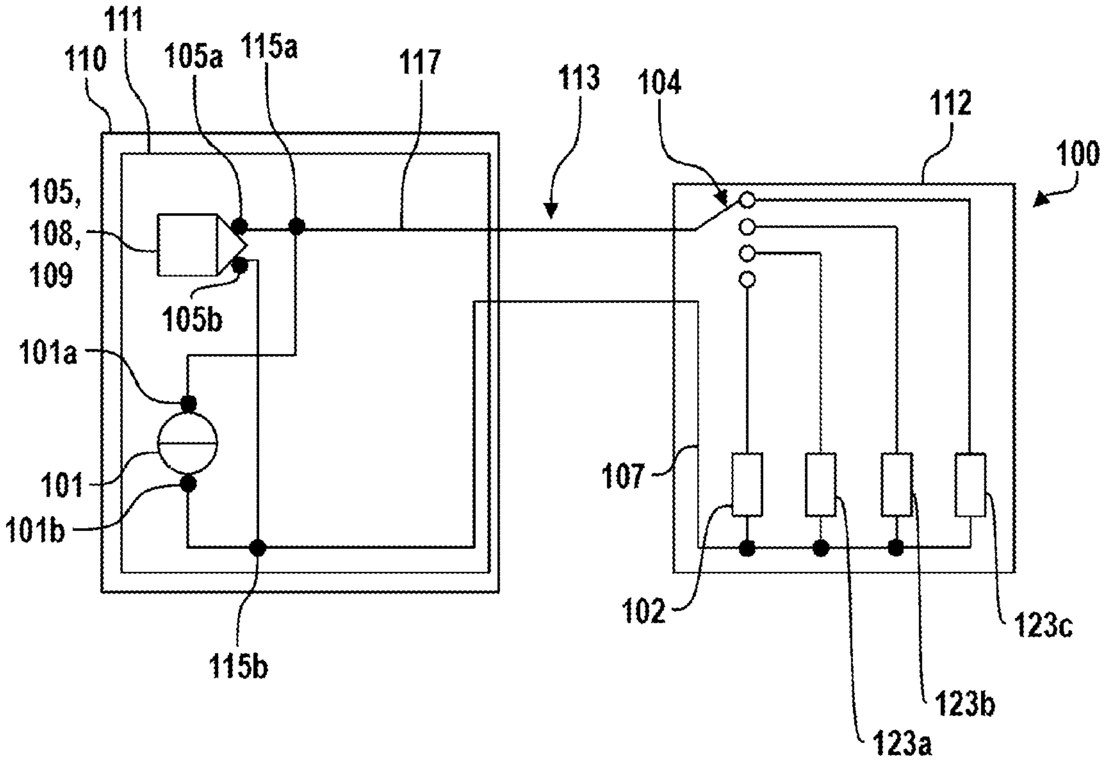
FIG. 7 shows a temperature measuring device according to a sixth embodiment.

FIG. 7 shows a temperature measuring device 100 according to a sixth embodiment. The temperature measuring device 100 of the sixth embodiment (FIG. 7) is largely identical to the temperature measuring device 100 of the fifth embodiment (FIG. 6). Mainly the differences compared with the fifth embodiment are therefore described below. For the aspects of the sixth embodiment which are not described below, it can be assumed that they are identical to those of the fifth embodiment.

In FIG. 7, the switching unit 104 is provided in the vacuum container 112. It can be desirable in the embodiment of FIG. 7 that errors in the supply lines of the temperature resistors 102, 123a-123c cancel each other out because all the temperature resistors 102, 123a-123c share a common supply line 117.

Figure 8:
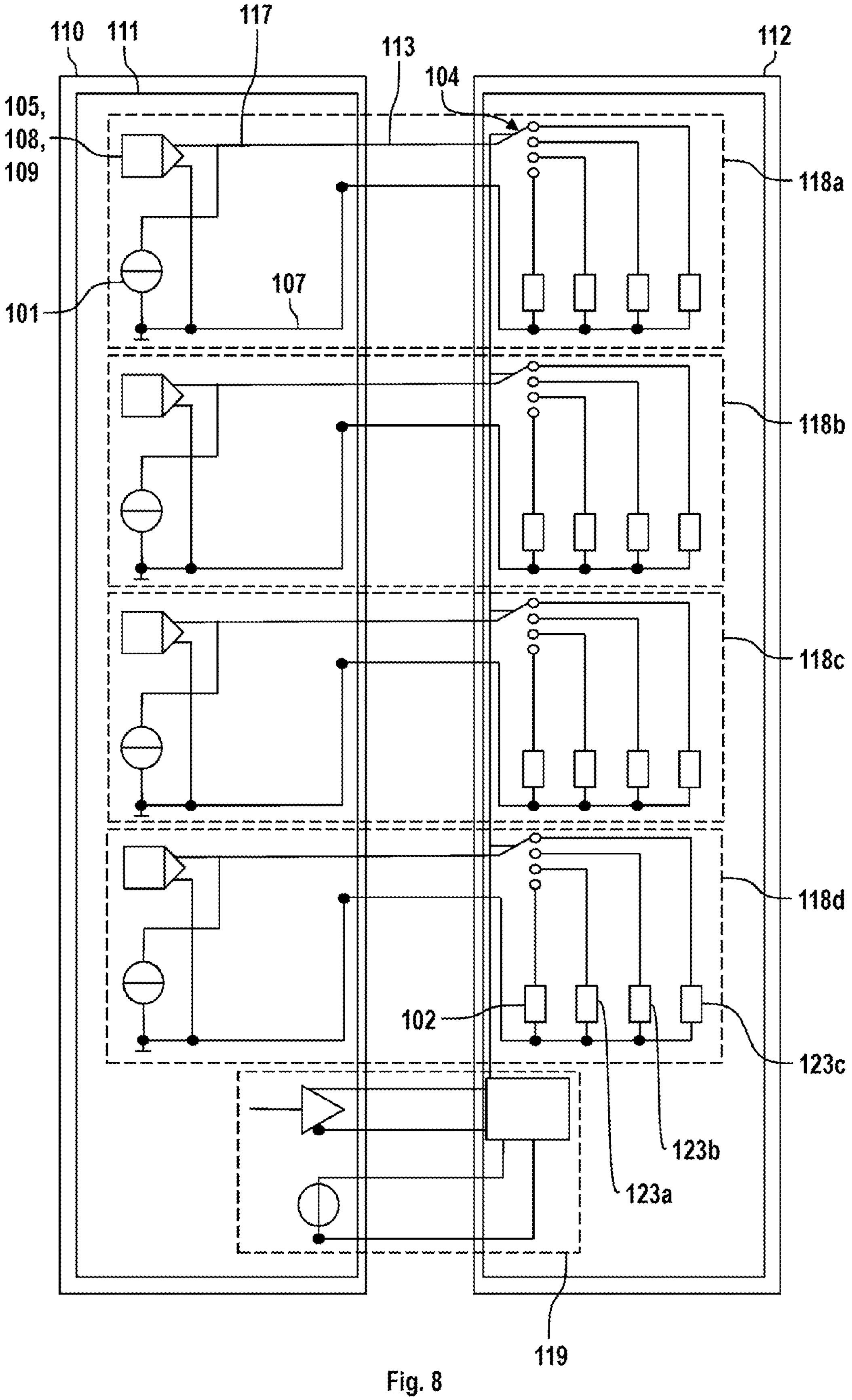
FIG. 8 shows a temperature measuring device according to a seventh embodiment.

FIG. 8 shows a temperature measuring device 100 according to a seventh embodiment. The temperature measuring device 100 of the seventh embodiment (FIG. 8) is largely identical to the temperature measuring device 100 of the sixth embodiment (FIG. 7). Mainly the differences compared with the sixth embodiment are therefore described below. For the aspects of the seventh embodiment which are not described below, it can be assumed that they are identical to those of the sixth embodiment.

The temperature measuring device 100 comprises four temperature measuring modules 118a-118d, which substantially correspond to the temperature measuring device 100 of FIG. 7. The switching units 104 of the respective temperature measuring modules 118a-118d are controlled by a common switching unit controller 119, with the result that the switching units 104 switch synchronously to one another.

Figure 9:
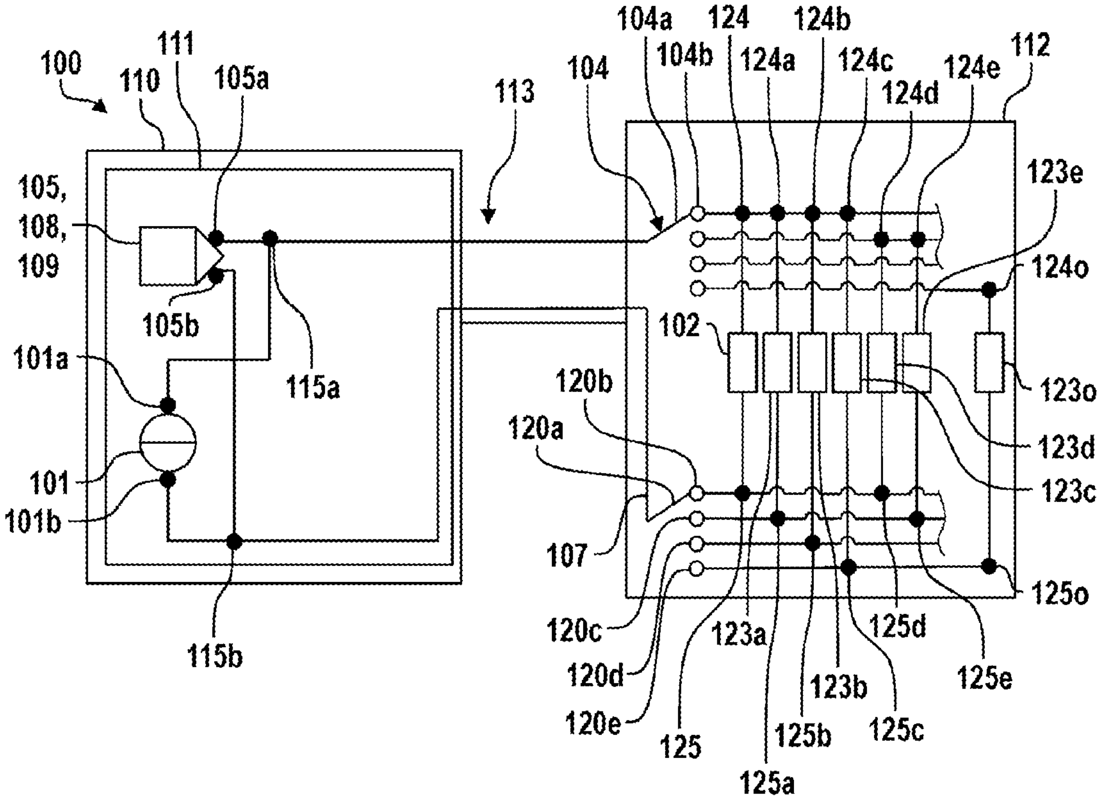
FIG. 9 shows a temperature measuring device according to an eighth embodiment.

FIG. 9 shows a temperature measuring device 100 according to an eighth embodiment. The temperature measuring device 100 of the eighth embodiment (FIG. 9) is largely identical to the temperature measuring device 100 of the sixth embodiment (FIG. 7). Mainly the differences compared with the sixth embodiment are therefore described below. For the aspects of the eighth embodiment which are not described below, it can be assumed that they are identical to those of the sixth embodiment.

The temperature measuring device 100 of FIG. 9 comprises seventeen temperature resistors: a reference resistor 102 between line nodes 124, 125, and sixteen measurement temperature resistors 123a-123o between line nodes 124a-124o and 125a-125o.

In the temperature measuring device 100 of FIG. 9, a second switching unit 120 is additionally provided in the vacuum container 112. In each state of the switching unit 104, it connects the current source 101 to a plurality of temperature resistors 102, 123a-123o. In the example of FIG. 9, the switching unit 104 can switch between four states in which four temperature resistors 102, 123a-123o are connected in each case to the connection point 101a of the current source 101. In the illustration of FIG. 9, the switching unit 104 is connecting the current source 101 to the temperature resistors 102, 123a-123c (state 1 of the switching unit 104 with the switching element 104a at the switching point 104b). The other states of the switching unit 104 which are not shown connect the current source 101 to the temperature resistors 123*d*-123*g* (state 2 of the switching unit 104 with the switching element 104*a* at the switching point 104*e*), 123*h*-123*k* (state 3 of the switching unit 104 with the switching element 104*a* at the switching point 104*d*) and 123*l*-123*o* (state 4 of the switching unit 104 with the switching element 104*a* at switching point 104*c*).

The second switching unit 120 switches between four states in which every fourth temperature resistor 102, 123*a*-123*o* is connected to the connection point 101*b* of the current source 101. In the illustration of FIG. 9, the second switching unit 120 is connecting the current source 101 to the temperature resistors 102, 123*d*, 123 *h* and 123*l* (state 1 of the second switching unit 120 with the switching element 120*a* at the switching point 120*b*). The other states of the second switching unit 120 which are not shown connect the current source 101 to the temperature resistors 123*a*, 123*e*, 123*i* and 123*m* (state 2 of the second switching unit 120 with the switching element 120*a* at the switching point 120*c*); 123*b*, 123*f*, 123*j* and 123*n* (state 3 of the second switching unit 120 with the switching element 120*a* at the switching point 120*d*); and 123*c*, 103*g*, 123*k* and 123*o* (state 4 of the second switching unit 120 with the switching element 120*a* at the switching point 120*e*).

By switching the switching units 104, 120 at different clock cycles, each temperature resistor 102, 123*a*-123*o* can be individually connected to the current source 101 and the voltage recording unit 105. This allows a matrix of temperature resistors 102, 123*a*-123*o* to be provided, without increasing the number of lines 107, 117.

Figure 10:
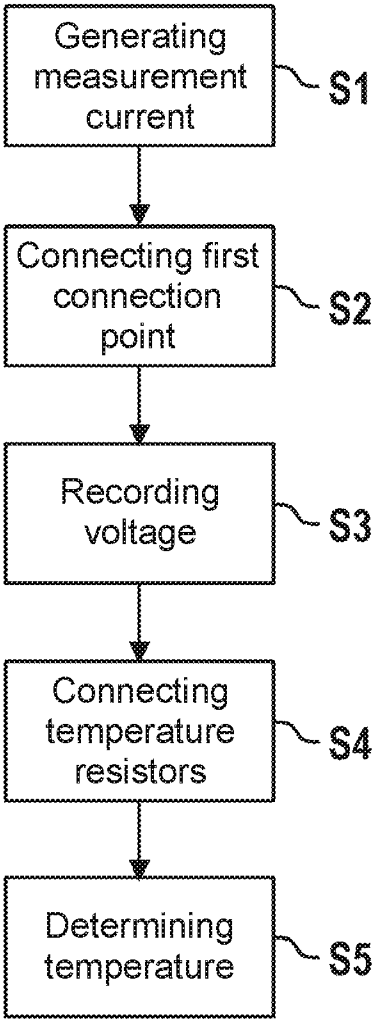
FIG. 10 shows a method for measuring a temperature.

FIG. 10 shows a method for measuring a temperature at or in an optical system 20. The method of FIG. 10 can be carried out via a temperature measuring device 100 of FIG. 2 to 9. The method comprises a step S1, in which the current source 101 generates the measurement current. In a step S2, the first switching unit 104 connects the first connection point 101*a* of the current source 101 optionally to one or more first line nodes 124, 124*a*-124*o*. In a step S3, the voltage recording unit 105 records the voltage at the temperature resistors 102, 103, 123*a*-123*o* (at one temperature resistor in each case). In a step S4, the first line 107 connects at least two second line nodes 125, 125*a*-125*o* to the first connection point 105*b* of the voltage recording unit 105. In a step S5, the temperature at or in the optical system is determined based on the recorded voltage.

Steps S1-S5 can be performed in any order. Step S4 of the common electrical connection can precede all other steps. Step S3 of the voltage measurement can be repeated as often as desired in order to measure the voltage successively at the respective temperature resistor 102, 103, 123*a*-123*o* supplied with current.

Although the present disclosure has been described on the basis of exemplary embodiments, it can be modified in diverse ways. For example, any number of measurement temperature resistors 103, 123*a*-123*o* can be used, or a plurality of reference temperature resistors 102 can be used. A voltage source can also be used as a drive source instead of the current source 101.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
100 Temperature measuring device
101 Drive source
101*a*, 101*b* Connection point of the current source
102 Reference temperature resistor
102*a*, 102*b* Connection point of the reference temperature resistor
103 Measurement temperature resistor
103*a*, 103*b* Connection point of the measurement temperature resistor
104 First switching unit
104*a* Switching element
104*b*-104*e* Switching point
105 Voltage recording unit
105*a*, 105*b* Connection point of the voltage recording unit
106 Further switching unit
106*a* Switching element
106*b*-106*e* Switching point
107 First line
108 Digital-to-analog converter
109 Analog-to-digital converter
110 Housing
111 Temperature measurement circuit board
112 Vacuum container
113 Vacuum cable
115*a*, 115*b* Line node
116*a*-116*c* Supply line
117 Common supply line
118*a*-118*d* Temperature measuring module
119 Switching unit controller
120 Second switching unit
120*a* Switching element
120*b*-120*e* Switching point
121 Common line
123*a*-123*o* Measurement temperature resistor
124, 124*a*-124*o* First line node
125, 125*a*-125*o* Second line node
130 Temperature determination unit
$C_{ADC}$ Output signal
$C_{DAC}$ Input voltage
$I_m$ Current
$R_{ref}$ Reference resistor
$R_T$ Measurement resistor
S1-S5 Method steps

What is claimed is:

1. A temperature measuring device, comprising:

a drive source configured to generate a measurement current or a measurement voltage between first and second connection points of the drive source;

a plurality of temperature resistors comprising a reference temperature resistor and a measurement temperature resistor, the reference temperature resistor being between a first line node and a second line node, the measurement temperature resistor being between a first line node and a second line node;

a first switching unit configured to connect the first connection point of the drive source to at least one member selected from the group consisting of the first line node of the reference temperature resistor and the first line node of the measurement temperature resistor;

a voltage recording unit configured to sense a voltage at the temperature resistors;

a first line electrically connecting the second line node of the reference temperature resistor and the second line node of the measurement temperature resistor together to a first connection point of the voltage recording unit; and a temperature determination unit configured to be communicatively coupled to the voltage recording unit to: i) receive the voltage recorded by the voltage recording unit; and ii) determine a temperature at or in an optical system based on the voltage received from the voltage recording unit.

2. The temperature measuring device of 1, wherein the temperature determination unit is configured to:

calculate a resistance value of the measurement temperature resistor depending on a measurement voltage recorded by the voltage recording unit at the measurement temperature resistor and a reference voltage recorded by the voltage recording unit at the reference temperature resistor; and determine the temperature at or in the optical system based on the calculated resistance value.

3. The temperature measuring device of claim 1, comprising a plurality of measurement temperature resistors.

4. The temperature measuring device of claim 3, wherein:

each measurement temperature resistor is between first and second line nodes; and the first line connects all the second line nodes of the measurement temperature resistors together to the first connection point of the voltage recording unit.

5. The temperature measuring device of claim 1, further comprising a printed circuit board comprising the drive source, the voltage recording unit, the temperature determination unit, and an interface unit configured to connect the first line.

6. The temperature measuring device of claim 5, wherein the printed circuit board further comprises at least one member selected from the group consisting of the first switching unit and the reference temperature resistor.

7. The temperature measuring device of claim 1, further comprising a second switching unit configured to connect the first connection point of the voltage recording unit to both the second line node of the reference temperature resistor and the second line node of measurement temperature resistor, wherein the first switching unit and the second switching unit are configured to be clocked.

8. The temperature measuring device of 1, wherein the temperature determination unit is configured to:

calculate a resistance value of the measurement temperature resistor depending on a measurement voltage recorded by the voltage recording unit at the measurement temperature resistor and a reference voltage recorded by the voltage recording unit at the reference temperature resistor; and determine the temperature at or in the optical system based on the calculated resistance value, and wherein the temperature measuring device comprises a plurality of measurement temperature resistors.

9. The temperature measuring device of claim 8, wherein:

each measurement temperature resistor is between first and second line nodes; and the first line connects all the second line nodes of the measurement temperature resistors together to the first connection point of the voltage recording unit.

10. The temperature measuring device of 1, wherein the temperature determination unit is configured to:

calculate a resistance value of the measurement temperature resistor depending on a measurement voltage recorded by the voltage recording unit at the measurement temperature resistor and a reference voltage recorded by the voltage recording unit at the reference temperature resistor; and determine the temperature at or in the optical system based on the calculated resistance value, and wherein the temperature measuring device further comprises a printed circuit board comprising the drive source, the voltage recording unit, the temperature determination unit, and an interface unit configured to connect the first line.

11. The temperature measuring device of claim 10, wherein the printed circuit board further comprises at least one member selected from the group consisting of the first switching unit and the reference temperature resistor.

12. The temperature measuring device of 1, wherein the temperature determination unit is configured to:

calculate a resistance value of the measurement temperature resistor depending on a measurement voltage recorded by the voltage recording unit at the measurement temperature resistor and a reference voltage recorded by the voltage recording unit at the reference temperature resistor; and determine the temperature at or in the optical system based on the calculated resistance value, and the temperature measuring device further comprises a second switching unit configured to connect the first connection point of the voltage recording unit to both the second line node of the reference temperature resistor and the second line node of measurement temperature resistor, wherein the first switching unit and the second switching unit are configured to be clocked.

13. The temperature measuring device of 1, wherein the temperature determination unit is configured to:

calculate a resistance value of the measurement temperature resistor depending on a measurement voltage recorded by the voltage recording unit at the measurement temperature resistor and a reference voltage recorded by the voltage recording unit at the reference temperature resistor; and determine the temperature at or in the optical system based on the calculated resistance value, and wherein the temperature determination unit is configured to:

calculate a resistance value of the measurement temperature resistor depending on a measurement voltage recorded by the voltage recording unit at the measurement temperature resistor and a reference voltage recorded by the voltage recording unit at the reference temperature resistor; and determine the temperature at or in the optical system based on the calculated resistance value, and wherein the temperature measuring device comprises a plurality of measurement temperature resistors.

14. An apparatus, comprising:

a temperature measuring device according to claim 1; and the optical system, wherein:

the optical system comprises at least one member selected from the group consisting of a mirror, a lens element and an actuator for a mirror or a lens element;

the temperature resistor is arranged at or in the optical system; and the apparatus is a lithography apparatus.

15. The apparatus of claim 14, further comprising:

a first closed area in which the optical system and the at least one measurement temperature resistor are disposed;

a second closed area spatially separated from the first closed area the drive source and the voltage recording unit being disposed in the second closed area; and connecting lines electronically connecting the first closed area and the second closed area so that the drive source is configured to supply the measurement temperature resistor with a member selected from the group consisting of a current or a voltage; and the connecting lines comprise the first line.

16. The apparatus of claim 15, wherein a vacuum is present in the first closed area, and no vacuum is present in the second closed area.

17. The apparatus of claim 16, wherein at least one of the following holds:

at least one member selected from the group consisting of the reference temperature resistor and the first switching unit is in the first closed area; and at least one member selected from the group consisting of the reference temperature resistor and the first switching unit is in the second closed area.

18. The apparatus of claim 15, wherein at least one of the following holds:

at least one member selected from the group consisting of the reference temperature resistor and the first switching unit is in the first closed area; and at least one member selected from the group consisting of the reference temperature resistor and the first switching unit is in the second closed area.

19. The apparatus of claim 14, wherein the apparatus is an EUV lithography apparatus.

20. A method, comprising:

i) providing an apparatus, comprising:

a temperature measuring device according to claim 1; and the optical system, wherein:

the optical system comprises at least one member selected from the group consisting of a mirror, a lens element and an actuator for a mirror or a lens element;

the temperature resistor is arranged at or in the optical system; and the apparatus is a lithography apparatus;

ii) generating a measurement current between the first and second connection points of the drive source;

iii) using the switching unit to connect the first connection point of the drive source to at least one member selected from the group consisting of the first line node of the reference temperature resistor and the first line node of the measurement temperature resistor;

iv) using the voltage recording unit to record the voltage at the temperature resistors;

v) electrically connecting the first connection point of the voltage recording unit, with the first line, the second line node of the reference temperature resistor and the second line node of the measurement temperature resistor; and vi) determining the temperature at or in the optical system based on the voltage recorded by the voltage recording unit.

* * * * *